US012604668B2

(12) United States Patent (10) Patent No.: US 12,604,668 B2
Shibata et al. (45) Date of Patent: Apr. 14, 2026

(54) MAGNETIC DOMAIN WALL MOVEMENT ELEMENT AND MAGNETIC ARRAY

(71) Applicant: TDK CORPORATION, Tokyo (JP)

(72) Inventors: Tatsuo Shibata, Tokyo (JP); Tomoyuki Sasaki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 575 days.

(21) Appl. No.: 17/488,436

(22) Filed: Sep. 29, 2021

(65) Prior Publication Data

US 2022/0109102 A1 Apr. 7, 2022

(30) Foreign Application Priority Data

Oct. 1, 2020 (WO) .................. PCT/JP2020/037408
Aug. 24, 2021 (JP) .................................. 2021-136601

(51) Int. Cl.
*H10N 50/10* (2023.01)
*G01R 33/09* (2006.01)
(Continued)

(52) U.S. Cl.
CPC ........... *H10N 50/10* (2023.02); *G01R 33/093* (2013.01); *G11C 11/161* (2013.01); (Continued)

(58) Field of Classification Search
CPC ........ H10N 50/10; H10N 50/80; H10N 50/85; H10N 52/101; H10N 52/01; G01R 33/093; G01R 33/1292; G11C 11/161; G11C 11/1675; G11C 19/0841; G11C 11/1659; G11C 11/1673; G11C 11/18; H10B 61/00; (Continued)

(56) References Cited

U.S. PATENT DOCUMENTS

2003/0168673 A1* 9/2003 Yuasa ..................... H10N 50/10
2006/0180839 A1* 8/2006 Fukumoto ............... H01F 10/30
257/295
(Continued)

FOREIGN PATENT DOCUMENTS

CN 1094835 A * 11/1994 ............. B82Y 10/00
CN 102479541 A * 5/2012 ........... G01R 33/091
(Continued)

*Primary Examiner* — Mohammed Shamsuzzaman
(74) *Attorney, Agent, or Firm* — Oliff PLC

(57) ABSTRACT

A magnetic domain wall movement element according to the present embodiment includes a magnetoresistance effect element that has a reference layer, a nonmagnetic layer, and a magnetic domain wall movement layer in order from a side closer to a substrate; and a first magnetization fixed layer and a second magnetization fixed layer which are each in contact with the magnetic domain wall movement layer and are separated from each other, wherein the magnetic domain wall movement layer includes a plurality of ferromagnetic layers and a plurality of insertion layers sandwiched between the plurality of ferromagnetic layers, wherein the ferromagnetic layer contains Co and Fe and has perpendicular magnetic anisotropy, and wherein, when writing is performed, a write current is allowed to flow between the first magnetization fixed layer and the second magnetization fixed layer along the magnetic domain wall movement layer.

15 Claims, 12 Drawing Sheets

(51) Int. Cl.

| | |
|---|---|
| *G11C 11/16* | (2006.01) |
| *H10B 61/00* | (2023.01) |
| *H10N 50/80* | (2023.01) |
| *H10N 50/85* | (2023.01) |

(52) U.S. Cl.

CPC .......... *G11C 11/1675* (2013.01); *H10B 61/00* (2023.02); *H10N 50/80* (2023.02); *H10N 50/85* (2023.02)

(58) Field of Classification Search

CPC ....... H10B 61/22; H10B 99/00; H01L 27/105; H01L 29/82

See application file for complete search history.

(56) References Cited

U.S. PATENT DOCUMENTS

| | | | | |
|---|---|---|---|---|
| 2006/0237808 | A1 * | 10/2006 | Saito | H10N 50/10 |
| | | | | 257/E27.005 |
| 2006/0238191 | A1 * | 10/2006 | Saito | G11C 19/0808 |
| | | | | 324/252 |
| 2008/0213627 | A1 * | 9/2008 | Ohsawa | G11C 11/16 |
| | | | | 428/811.2 |
| 2010/0188890 | A1 * | 7/2010 | Fukami | B82Y 25/00 |
| | | | | 365/158 |
| 2011/0297909 | A1 * | 12/2011 | Fukami | G11C 11/1655 |
| | | | | 257/E27.005 |
| 2012/0069640 | A1 | 3/2012 | Nagase et al. | |
| 2013/0113058 | A1 * | 5/2013 | Fukami | H10N 50/01 |
| | | | | 257/421 |
| 2013/0141966 | A1 * | 6/2013 | Ohno | H10N 50/10 |
| | | | | 365/158 |
| 2013/0175645 | A1 * | 7/2013 | Sugibayashi | H01F 10/3286 |
| | | | | 257/421 |
| 2013/0187248 | A1 | 7/2013 | Kariyada et al. | |
| 2013/0221459 | A1 * | 8/2013 | Jan | H10N 50/85 |
| | | | | 257/E29.323 |
| 2015/0162042 | A1 * | 6/2015 | Kimura | G11B 5/737 |
| | | | | 204/192.1 |
| 2017/0279038 | A1 * | 9/2017 | Wu | H01F 10/3218 |
| 2019/0035446 | A1 * | 1/2019 | Shibata | G11C 11/16 |
| 2019/0355895 | A1 * | 11/2019 | Song | H10N 50/80 |
| 2019/0363245 | A1 * | 11/2019 | Sato | H01L 22/20 |
| 2020/0258559 | A1 * | 8/2020 | Ashida | G11C 11/5607 |
| 2020/0273511 | A1 * | 8/2020 | Ashida | H10N 50/10 |
| 2021/0098690 | A1 * | 4/2021 | Ashida | H10N 50/10 |
| 2021/0376229 | A1 * | 12/2021 | Ashida | H10N 50/80 |
| 2021/0399208 | A1 | 12/2021 | Nishioka et al. | |
| 2022/0051708 | A1 * | 2/2022 | Yamada | H10B 61/22 |
| 2022/0165934 | A1 * | 5/2022 | Yamada | H10N 50/10 |
| 2022/0190233 | A1 * | 6/2022 | Yonemura | H10N 50/85 |
| 2022/0376168 | A1 * | 11/2022 | Yamada | H10N 50/85 |
| 2022/0399487 | A1 * | 12/2022 | Yamada | H10B 61/22 |

FOREIGN PATENT DOCUMENTS

| | | | | | |
|---|---|---|---|---|---|
| CN | 102696071 | A | * | 9/2012 | B82Y 25/00 |
| CN | 104170074 | A | * | 11/2014 | G11C 11/161 |
| CN | 103887423 | B | * | 2/2018 | G11C 11/15 |
| CN | 103855299 | B | * | 9/2018 | G11C 11/161 |
| CN | 110462814 | A | * | 11/2019 | G01R 33/093 |
| EP | 2073213 | A1 | * | 6/2009 | G11C 11/14 |
| JP | 3560284 | B2 | * | 9/2004 | B82Y 25/00 |
| JP | 2006221703 | A | * | 8/2006 | G11C 11/161 |
| JP | 2007059927 | A | * | 3/2007 | G01R 33/093 |
| JP | 2008004944 | A | * | 1/2008 | B82Y 10/00 |
| JP | 2008097685 | A | * | 4/2008 | G11B 5/66 |
| JP | 2010219156 | A | * | 9/2010 | G11C 11/161 |
| JP | 2011205007 | A | * | 10/2011 | G11C 11/161 |
| JP | 2012-064774 | A | | 3/2012 | |
| JP | 2013026441 | A | * | 2/2013 | G11C 11/161 |
| JP | 2013-149857 | A | | 8/2013 | |
| JP | 5299735 | B2 | * | 9/2013 | |
| JP | 2013175598 | A | * | 9/2013 | |
| JP | 2014036146 | A | * | 2/2014 | G11C 11/161 |
| JP | 2016178252 | A | * | 10/2016 | G11C 14/0081 |
| JP | 2017016720 | A | * | 1/2017 | G11B 5/66 |
| JP | 6481805 | B1 | * | 3/2019 | G11C 11/161 |
| JP | 6499798 | B1 | * | 4/2019 | G11C 11/161 |
| JP | 6555404 | B1 | * | 8/2019 | G11C 11/15 |
| JP | 2019176099 | A | * | 10/2019 | F16F 13/18 |
| JP | 2019220544 | A | * | 12/2019 | G11C 11/161 |
| JP | 2020021857 | A | * | 2/2020 | G11C 11/15 |
| JP | 2020141132 | A | * | 9/2020 | G11C 11/15 |
| JP | 2021052050 | A | * | 4/2021 | G11C 11/161 |
| JP | 2021110787 | A | * | 8/2021 | G11C 11/161 |
| JP | 6965760 | B2 | * | 11/2021 | G11C 11/161 |
| KR | 20180026195 | A | * | 3/2018 | H01L 43/08 |
| WO | 2009/001706 | A1 | | 12/2008 | |
| WO | WO-2009101827 | A1 | * | 8/2009 | B82Y 25/00 |
| WO | 2009/122990 | A1 | | 10/2009 | |
| WO | WO-2010074130 | A1 | * | 7/2010 | G11C 11/16 |
| WO | WO-2010074132 | A1 | * | 7/2010 | G11C 11/14 |
| WO | WO-2016011435 | A1 | * | 1/2016 | G11C 11/161 |
| WO | WO-2020026637 | A1 | * | 2/2020 | G11C 11/161 |
| WO | 2020045655 | A1 | | 3/2020 | |
| WO | 2020/230877 | A1 | | 11/2020 | |

* cited by examiner

MAGNETIC DOMAIN WALL MOVEMENT ELEMENT AND MAGNETIC ARRAY

CROSS-REFERENCE TO RELATED APPLICATION

This application is based upon and claims the benefit of priority from PCT International Application PCT/JP2020/037408, Oct. 1, 2020, and Japanese Patent Application No. 2021-136601, Aug. 24, 2021, the entire contents of which are incorporated herein by reference.

BACKGROUND

The present invention relates to a magnetic domain wall movement element and a magnetic array.

Next-generation non-volatile memories that will replace flash memories and the like which have reached their limits in miniaturization are attracting attention. For example, a magnetoresistive random access memory (MRAM), a resistive random access memory (ReRAM), a phase change random access memory (PCRAM), and the like are known as next-generation non-volatile memories.

An MRAM uses a change in resistance value caused by a change in magnetization direction for data recording. Data recording is carried out by each of variable magnetic resistance elements constituting the MRAM. For example, Patent Literature 1 describes a variable magnetic resistance element (magnetic domain wall movement element) capable of recording multi-valued data by moving a magnetic domain wall in a first ferromagnetic layer (a magnetic domain wall movement layer). Patent Literature 1 describes that a magnetization fixing region can be easily formed at both ends of the first ferromagnetic layer using magnetic coupling with a second ferromagnetic layer group.

CITATION LIST

Patent Literature

[Patent Literature 1]
PCT International Publication No. WO 2009/122990

SUMMARY

A magnetic domain wall movement element capable of stably expressing many states can be used for many purposes. One method of realizing a magnetic domain wall movement element capable of stably expressing many states is to increase a resistance change width (an MR ratio) of the magnetic domain wall movement element. When the resistance change width is large, a plurality of states can be assigned to the resistance change width, and many states can be stably expressed.

Further, another method of realizing a magnetic domain wall movement element capable of stably expressing many states is to improve controllability of an operation of the magnetic domain wall of the magnetic domain wall movement element. When the controllability of the magnetic domain wall is improved, many states can be assigned to the same resistance change width, and many states can be stably expressed.

On the other hand, it is difficult to realize a magnetic domain wall movement element having a large MR ratio and high controllability of the magnetic domain wall.

The present invention has been made in view of the above problems, and an object of the present invention is to provide a magnetic domain wall movement element and a magnetic array having a large MR ratio and high controllability of the magnetic domain wall.

(1) A magnetic domain wall movement element according to a first aspect includes a magnetoresistance effect element that has a reference layer, a nonmagnetic layer, and a magnetic domain wall movement layer in order from a side closer to a substrate; and a first magnetization fixed layer and a second magnetization fixed layer which are each in contact with the magnetic domain wall movement layer and are separated from each other, wherein the magnetic domain wall movement layer includes a plurality of ferromagnetic layers and a plurality of insertion layers sandwiched between the plurality of ferromagnetic layers, wherein the ferromagnetic layer contains Co and Fe and has perpendicular magnetic anisotropy, and wherein, when writing is performed, a write current is allowed to flow between the first magnetization fixed layer and the second magnetization fixed layer along the magnetic domain wall movement layer.

(2) In the magnetic domain wall movement element according to the aspect, the first magnetization fixed layer and the second magnetization fixed layer may have different thicknesses.

(3) In the magnetic domain wall movement element according to the aspect, the first magnetization fixed layer and the second magnetization fixed layer may each have a magnetic coupling layer and a ferromagnetic layer which are alternately stacked, and the number of the ferromagnetic layers included in the first magnetization fixed layer may be different from the number of the ferromagnetic layers included in the second magnetization fixed layer.

(4) In the magnetic domain wall movement element according to the aspect, the insertion layer may contain any one selected from the group consisting of MgO, Mg—Al—O, Mg, W, Mo, Ta, Pd, and Pt.

(5) In the magnetic domain wall movement element according to the aspect, the insertion layer may have a plurality of insertion regions dispersed in an island shape.

(6) In the magnetic domain wall movement element according to the aspect, a first insertion layer closest to the nonmagnetic layer among the insertion layers may contain any one selected from the group consisting of W, Mo, Ta, Pd and Pt, and any one of the insertion layers other than the first insertion layer may contain MgO or Mg—Al—O.

(7) In the magnetic domain wall movement element according to the aspect, a first ferromagnetic layer closest to the nonmagnetic layer among the ferromagnetic layers included in the magnetic domain wall movement layer may be thicker than other ferromagnetic layers included in the magnetic domain wall movement layer.

(8) In the magnetic domain wall movement element according to the aspect, an insertion layer farthest from the nonmagnetic layer among the insertion layers included in the magnetic domain wall movement layer may be thicker than other insertion layers included in the magnetic domain wall movement layer.

(9) In the magnetic domain wall movement element according to the aspect, a lower surface of each of the first magnetization fixed layer and the second magnetization fixed layer may be below an upper surface of the magnetic domain wall movement layer.

(10) The magnetic domain wall movement element according to the aspect may further include a perpendicular magnetic induction layer, wherein the perpendicular magnetic induction layer may be on the magnetic domain wall movement layer.

(11) In the magnetic domain wall movement element according to the aspect, the perpendicular magnetic induction layer may contain any one selected from the group consisting of MgO, Mg—Al—O, Mg, W, Mo, Ta, Pd, and Pt.

(12) In the magnetic domain wall movement element according to the aspect, the perpendicular magnetic induction layer may be located at at least one of a portion between the first magnetization fixed layer and the magnetic domain wall movement layer and a portion between the second magnetization fixed layer and the magnetic domain wall movement layer.

(13) The magnetic domain wall movement element according to the aspect may further include a first conductive layer in contact with the first magnetization fixed layer and a second conductive layer in contact with the second magnetization fixed layer, wherein the first conductive layer may be fitted to a recess formed in an upper surface of the first conductive layer.

(14) A magnetic array according to a second aspect includes a plurality of the magnetic domain wall movement elements according to the aspect.

Advantageous Effects of Invention

The magnetic domain wall movement element and the magnetic array according to the above aspect have a large MR ratio and high controllability of the magnetic domain wall.

DETAILED DESCRIPTION

Figure 1:
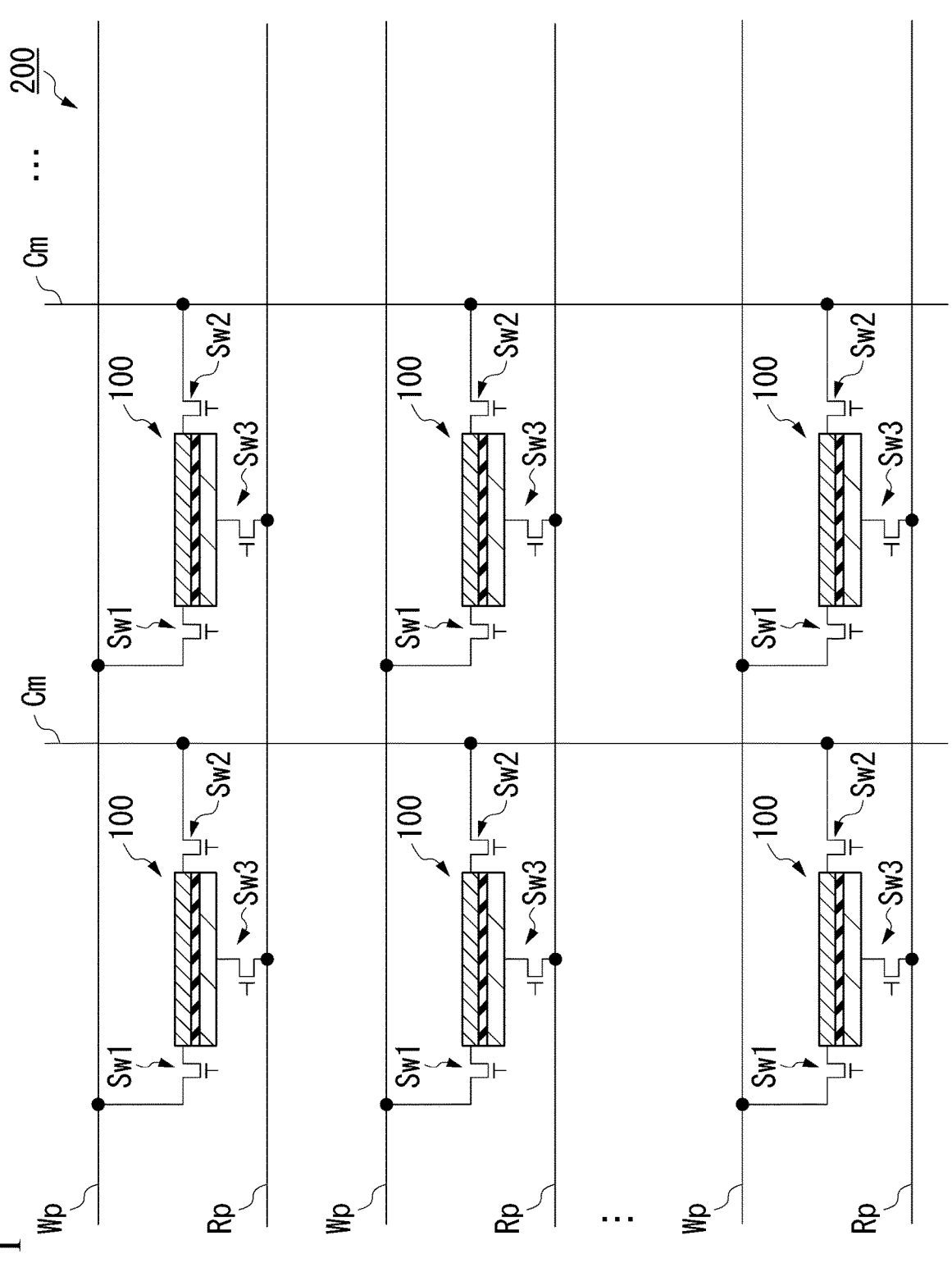
FIG. 1 is a configuration view of a magnetic array according to a first embodiment.

Hereinafter, the present embodiment will be described in detail with appropriate reference to the drawings. In the drawings used in the following description, a feature portion may be enlarged for convenience to make a feature of the present invention easy to understand, and dimensional ratios of each constituent element and the like may be different from the actual ones. Materials, dimensions, and the like exemplified in the following description are examples, and the present invention is not limited thereto and can be appropriately modified and carried out within the scope in which the effects of the present invention are exhibited.

First, directions will be defined. An x direction, and a y direction are directions substantially parallel to one surface of a substrate Sub (see FIG. 2) that will be described later. The x direction is a direction in which a magnetic domain wall movement layer that will be described later extends. The y direction is a direction orthogonal to the x direction. A z direction is a direction from the substrate Sub that will be described later toward a magnetic domain wall movement element. In the present specification, a +z direction may be expressed as "up" and a −z direction may be expressed as "down," but these expressions are for convenience and do not define the direction of gravity. Further, in this description, the term "extending in the x direction" means that, for example, the dimension in the x direction is larger than the smallest dimension among the dimensions in the x direction, the y direction, and the z direction. The same applies to cases of extending in other directions.

First Embodiment

FIG. 1 is a configuration view of a magnetic array according to a first embodiment. A magnetic array 200 includes a plurality of magnetic domain wall movement elements 100, a plurality of first wirings Wp, a plurality of second wirings Cm, a plurality of third wirings Rp, a plurality of first switching elements SW1, a plurality of second switching elements SW2, and a plurality of third switching elements SW3. The magnetic array 200 can be used in, for example, a magnetic memory, a multiply and accumulate calculation device, a neuromorphic device, a spin memristor, or a magneto-optical element.

<First Wiring, Second Wiring, and Third Wiring>

Each of the first wirings Wp is a write wiring. Each of the first wirings Wp electrically connects a power supply and one or more magnetic domain wall movement elements 100 to each other. The power supply is connected to one end of the magnetic array 200 during use.

Each of the second wirings Cm is a common wiring. The common wiring is a wiring which can be used both when data is written and when data is read. Each of the second wirings Cm electrically connects a reference potential and one or more magnetic domain wall movement elements 100 to each other. The reference potential is, for example, a ground. Each of the second wirings Cm may be provided in one of the plurality of magnetic domain wall movement elements 100 or may be provided over the plurality of magnetic domain wall movement elements 100.

Each of the third wirings Rp is a read wiring. Each of the third wirings Rp electrically connects a power supply and one or more magnetic domain wall movement elements 100 to each other. The power supply is connected to one end of the magnetic array 200 during use.

<First Switching Element, Second Switching Element, and Third Switching Element>

In FIG. 1, the first switching element SW1, the second switching element SW2, and the third switching element SW3 are connected to each of the plurality of magnetic domain wall movement elements 100. The first switching element SW1 is connected between the magnetic domain wall movement element 100 and the first wiring Wp. The second switching element SW2 is connected between the magnetic domain wall movement element 100 and the second wiring Cm. The third switching element SW3 is connected between the magnetic domain wall movement element 100 and the third wiring Rp.

When the first switching element SW1 and the second switching element SW2 are turned on, a write current flows between the first wiring Wp and the second wiring Cm which are connected to a predetermined magnetic domain wall movement element 100. When the second switching element SW2 and the third switching element SW3 are turned on, a read current flows between the second wiring Cm and the third wiring Rp which are connected to a predetermined magnetic domain wall movement element 100.

Each of the first switching element SW1, the second switching element SW2, and the third switching element SW3 is an element that controls the flow of the current. Each of the first switching element SW1, the second switching element SW2, and the third switching element SW3 is, for example, a transistor, an element using a phase change of a crystal layer such as an ovonic threshold switch (OTS), an element using a change in band structure such as a metal insulator transition (MIT) switch, an element using a breakdown voltage such as a Zener diode and an avalanche diode, and an element of which conductivity changes as an atomic position changes.

Any one of the first switching element SW1, the second switching element SW2, and the third switching element SW3 may be shared between the magnetic domain wall movement elements 100 connected to the same wiring. For example, in a case in which the first switching element SW1 is shared, one first switching element SW1 is provided on an upstream side (one end) of the first wiring Wp. For example, in a case in which the second switching element SW2 is shared, one second switching element SW2 is provided on an upstream side (one end) of the second wiring Cm. For example, in a case in which the third switching element SW3 is shared, one third switching element SW3 is provided on an upstream side (one end) of the third wiring Rp.

Figure 2:
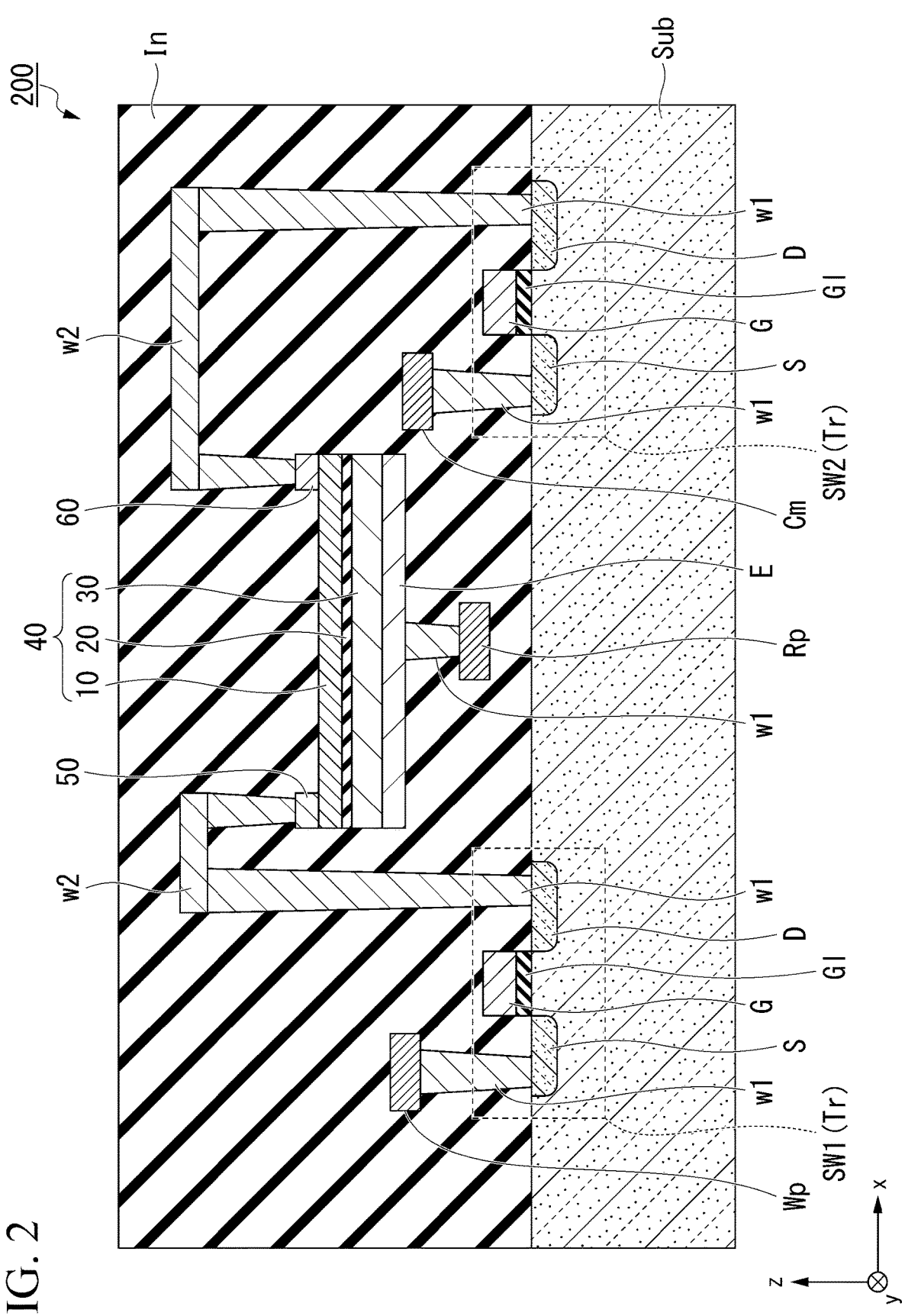
FIG. 2 is a cross-sectional view of a feature portion of the magnetic array according to the first embodiment.

FIG. 2 is a cross-sectional view of a feature portion of the magnetic array 200 according to the first embodiment. FIG. 2 is a cross section of one magnetic domain wall movement element 100 in FIG. 1 along an xz plane passing through the center of the width of a magnetic domain wall movement layer 10 in the y direction.

Each of the first switching element SW1 and the second switching element SW2 shown in FIG. 2 is a transistor Tr. The transistor Tr has a gate electrode G, a gate insulating film GI, and a source region S and a drain region D which are formed in a substrate Sub. The substrate Sub is, for example, a semiconductor substrate. The third switching element SW3 is electrically connected to the third wiring Rp and is located at, for example, a position shifted in the y direction in of FIG. 2.

Each of the transistors Tr and the magnetic domain wall movement element 100 are electrically connected to each other via wirings w1 and w2. Each of the wirings w1 and w2 contains a material having conductivity. The wiring w1 is a via wiring that extends in the z direction. The wiring w2 is an in-plane wiring that extends in any direction in an xy plane. Each of the wirings w1 and w2 is formed in an opening of an insulating layer In.

The insulating layer In is an insulating layer that insulates between the wirings of multilayer wirings or between the elements. The magnetic domain wall movement element 100 and the transistor Tr are electrically separated by an insulating layer In except for the wirings w1 and w2. The insulating layer In is, for example, silicon oxide ($SiO_x$), silicon nitride ($SiN_x$), silicon carbide (SiC), chromium nitride, silicon carbonitride (SiCN), silicon oxynitride (SiON), aluminum oxide ($Al_2O_3$), zirconium oxide ($ZrO_x$), or the like.

Although FIG. 2 shows an example in which the magnetic domain wall movement element 100 is located above the substrate Sub with the insulating layer In interposed therebetween, the magnetic domain wall movement element 100 may be located on the substrate Sub.

"Magnetic Domain Wall Movement Element"

Figure 3:
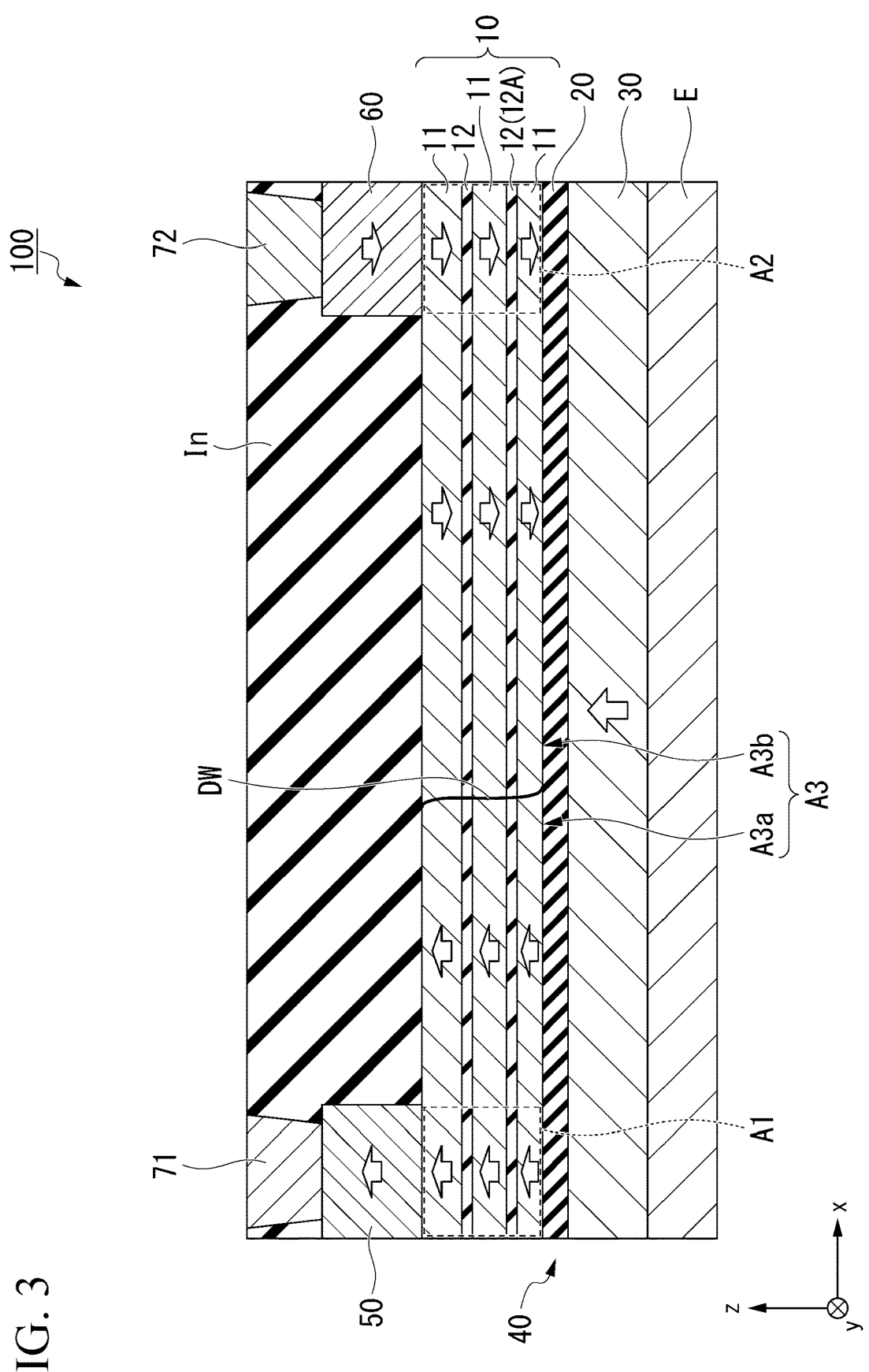
FIG. 3 is a cross-sectional view of a magnetic domain wall movement element according to the first embodiment.
Figure 4:
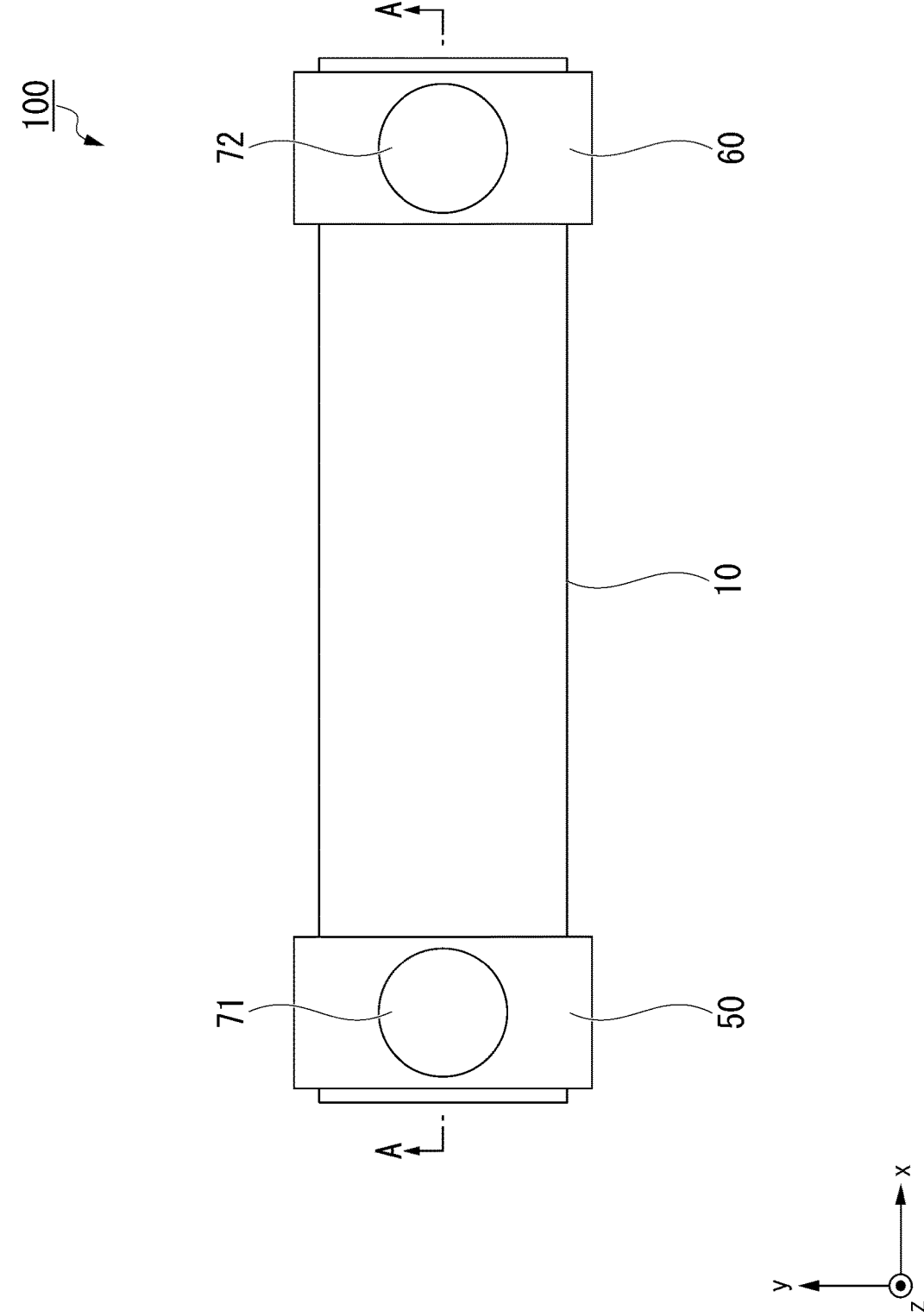
FIG. 4 is a plan view of the magnetic domain wall movement element according to the first embodiment.

FIG. 3 is a cross-sectional view of the magnetic domain wall movement element 100 along an xz plane passing through the center of the magnetic domain wall movement layer 10 in the y direction. FIG. 4 is a plan view of the magnetic domain wall movement element 100 in the z direction. An arrow shown in the drawing is an example of a magnetization orientation direction of a ferromagnetic material.

The magnetic domain wall movement element 100 is on an electrode E which is in charge of electrical connection with the third wiring Rp, for example. The magnetic domain wall movement element 100 has, for example, a magnetoresistance effect element 40, a first magnetization fixed layer 50, and a second magnetization fixed layer 60. A first conductive layer 71 is connected to the first magnetization fixed layer 50, and a second conductive layer 72 is connected to the second magnetization fixed layer 60. Each of the first conductive layer 71 and the second conductive layer 72 is a part of the wiring w1 in FIG. 2. A periphery of the magnetic domain wall movement element 100 is covered with the insulating layer In.

The magnetoresistance effect element 40 includes the magnetic domain wall movement layer 10, a nonmagnetic layer 20, and a reference layer 30. The magnetoresistance effect element 40 includes the reference layer 30, the nonmagnetic layer 20, and the magnetic domain wall movement layer 10 in that order from a side closer to the substrate Sub. When data is written to the magnetoresistance effect element 40, a write current is allowed to flow between the first magnetization fixed layer 50 and the second magnetization fixed layer 60 along the magnetic domain wall movement layer 10. When data is read from the magnetoresistance effect element 40, a current is applied in the z direction of the magnetoresistance effect element 40, and a read current is allowed to flow between the electrode E and the magnetic domain wall movement layer 10.

The magnetic domain wall movement layer 10 extends in the x direction. The magnetic domain wall movement layer 10 has a plurality of magnetic domains inside and has a magnetic domain wall DW at a boundary of the plurality of magnetic domains. The magnetic domain wall movement layer 10 is, for example, a layer capable of magnetically recording information by changing a magnetic state. The magnetic domain wall movement layer 10 may be called an analog layer or a magnetic recording layer.

The magnetic domain wall movement layer 10 has a first region A1, a second region A2, and a third region A3. The first region A1 is a region that overlaps the first magnetization fixed layer 50 in the z direction. The second region A2 is a region that overlaps the second magnetization fixed layer 60 in the z direction. The third region A3 is a region other than the first region A1 and the second region A2 of the magnetic domain wall movement layer 10. The third region A3 is, for example, a region interposed between the first region A1 and the second region A2 in the x direction.

The magnetization of the first region A1 is fixed by the magnetization of the first magnetization fixed layer 50. The magnetization of the second region A2 is fixed by the magnetization of the second magnetization fixed layer 60. In the state in which the magnetization is fixed, the magnetization does not reverse in a normal operation of the magnetic domain wall movement element 100 (no external force exceeding estimation is applied). For example, the first region A1 and the second region A2 have opposite magnetization orientation directions.

The third region A3 is a region in which a magnetization direction changes and the magnetic domain wall DW can move. The third region A3 has a first magnetic domain A3*a* and a second magnetic domain A3*b*. The first magnetic domain A3*a* and the second magnetic domain A3*b* have opposite magnetization orientation directions. A boundary between the first magnetic domain A3*a* and the second magnetic domain A3*b* is the magnetic domain wall DW. The magnetization of the first magnetic domain A3*a* is oriented in the same direction as the magnetization of the first region A1, for example. The magnetization of the second magnetic domain A3*b* is oriented in the same direction as the magnetization of the adjacent second region A2, for example. In principle, the magnetic domain wall DW moves in the third region A3 and does not invade the first region A1 or the second region A2.

When a ratio of the first magnetic domain A3*a* and the second magnetic domain A3*b* in the third region A3 changes, the magnetic domain wall DW moves. The magnetic domain wall DW moves by a write current being allowed to flow in the x direction of the third region A3. For example, when a write current (for example, a current pulse) is applied in a +x direction of the third region A3, electrons flow in a −x direction opposite to the current, and thus the magnetic domain wall DW moves in the −x direction. In a case in which a current flows from the first magnetic domain A3*a* to the second magnetic domain A3*b*, the electrons spin-polarized in the second magnetic domain A3*b* reverse the magnetization of the first magnetic domain A3*a*. By reversing the magnetization of the first magnetic domain A3*a*, the magnetic domain wall DW moves in the −x direction.

The magnetic domain wall movement layer 10 has a ferromagnetic layer 11 and an insertion layer 12. The ferromagnetic layer 11 and the insertion layer 12 are alternately stacked. The adjacent ferromagnetic layers 11 are magnetically coupled to each other with the insertion layer 12 interposed therebetween.

The ferromagnetic layer 11 contains Co and Fe. The ferromagnetic layer 11 is, for example, a CoFe alloy. The ferromagnetic layer 11 may be an alloy containing Co, Fe, and one or more elements of B, C, and N. The ferromagnetic layer 11 is, for example, a Co—Fe—B alloy.

The ferromagnetic layer 11 has perpendicular magnetic anisotropy. To have the perpendicular magnetic anisotropy is to have an axis of easy magnetization in a direction intersecting with (orthogonal to) the film surface. A film thickness of each of the ferromagnetic layers 11 is, for example, 1.5 nm or less.

The ferromagnetic layer 11 is an alloy containing Co and Fe having a thickness of 1.5 nm or less, for example. The alloy containing Co and Fe has a greater magnetoresistance effect than a stacked body exhibiting perpendicular magnetic anisotropy such as a stacked film of Co and Ni, a stacked film of Co and Pt, and a stacked film of Co and Pd. Further, the alloy containing Co and Fe exhibits a large magnetoresistance effect when the thickness is 1.5 nm or less. When the magnetoresistance effect of the magnetic domain wall movement layer 10 is large, an MR ratio of the magnetic domain wall movement element 100 becomes large.

The film thicknesses, the materials, and the like of a plurality of ferromagnetic layers 11 may be the same or different.

The insertion layer 12 is between the ferromagnetic layers 11. The insertion layer 12 induces the perpendicular magnetic anisotropy in the ferromagnetic layer 11 due to an effect of an interface with the ferromagnetic layer 11.

The insertion layer 12 contains, for example, any one selected from the group consisting of MgO, Mg—Al—O, Mg, W, Mo, Ta, Pd, and Pt. These materials enhance the perpendicular magnetic anisotropy in the adjacent ferromagnetic layers 11. In a case in which the insertion layer 12 is MgO or Mg—Al—O, the MR ratio of the magnetic domain wall movement element 100 is particularly improved. In a case in which the insertion layer 12 is any one of Mg, W, Mo, Ta, Pd, and Pt, a resistance value of the magnetic domain wall movement element 100 is lowered and power consumption is lowered. In a case in which the insertion layer 12 is any of Mo, Ta, Pd, and Pt, spin is injected into the ferromagnetic layer 11 due to a spin Hall effect, and the magnetization of the ferromagnetic layer 11 is easily reversed. Mg—Al—O is an oxide of Mg and Al and means that a composition ratio does not matter. Mg—Al—O is, for example, $MgAl_2O_4$ having a spinel structure.

A film thickness of the insertion layer 12 is, for example, 1 nm or less. When the film thickness of the insertion layer 12 is sufficiently thin, magnetic coupling between the adjacent ferromagnetic layers 11 becomes sufficiently strong.

The materials and the like of a plurality of insertion layers 12 may be the same or different. For example, a first insertion layer 12A may contain any one selected from the group consisting of W, Mo, Ta, Pd and Pt, and any one of the insertion layers 12 located above the first insertion layer 12A may contain MgO or Mg—Al—O. The first insertion layer 12A is an insertion layer closest to the nonmagnetic layer 20 among the insertion layers 12. The magnetic domain wall movement element 100 is processed from above at the time of manufacture. By MgO or Mg—Al—O which is hard and difficult to be processed being disposed in an upper portion of the magnetic domain wall movement layer 10, MgO or Mg—Al—O functions as an etching stopper.

Figure 12:
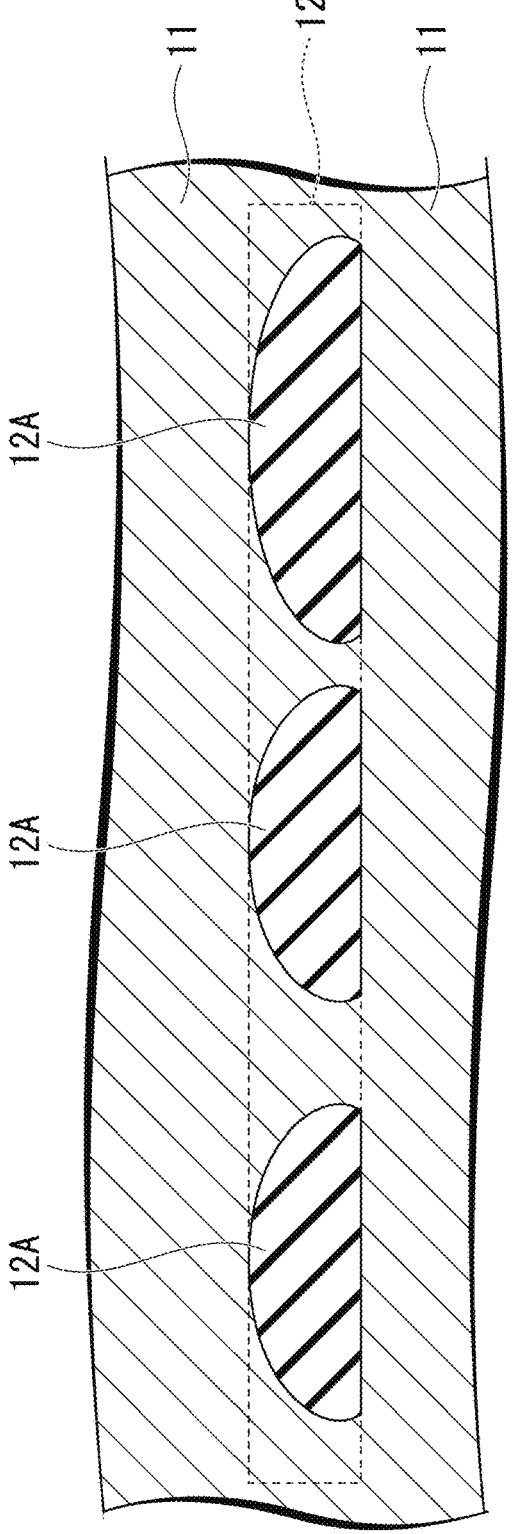
FIG. 12 is a cross-sectional partial view of a magnetic domain wall movement layer according to an embodiment.

The insertion layer 12 may be one in which a nonmagnetic material containing, for example, any one selected from the group consisting of MgO, Mg—Al—O, Mg, W, Mo, Ta, Pd, and Pt is dispersed in an alloy containing Co and Fe. That is, the insertion layer 12 does not have to be sufficiently thin (at an atomic number layer level) and to form a complete layer. For example, as shown in FIG. 12, the insertion layer 12 may be one which has a plurality of insertion regions obtained by dispersing a material containing any one selected from the above material group in an island shape in an alloy containing Co and Fe. These materials can enhance the perpendicular magnetic anisotropy of each of the insertion layer 12 and the ferromagnetic layer 11 adjacent thereto. A film thickness of the insertion layer 12 may be, for example, 1 nm or more. In a case in which the insertion layer 12 contains Co and Fe, the magnetic coupling with the adjacent ferromagnetic layer 11 becomes sufficiently strong even if the film thickness is thick.

The nonmagnetic layer 20 is located between the magnetic domain wall movement layer 10 and the reference layer 30. The nonmagnetic layer 20 is stacked on one surface of the reference layer 30.

The nonmagnetic layer 20 is made of, for example, a nonmagnetic insulator, a nonmagnetic semiconductor, or a nonmagnetic metal. The nonmagnetic insulator is, for example, $Al_2O_3$, $SiO_2$, MgO, $MgAl_2O_4$, or a material in which a part of Al, Si, or Mg is replaced with Zn, Be, or the like. These materials have a large bandgap and are excellent in insulating properties. In a case in which the nonmagnetic layer 20 is made of the nonmagnetic insulator, the nonmagnetic layer 20 is a tunnel barrier layer. The nonmagnetic metal is, for example, Cu, Au, Ag, or the like. The nonmagnetic semiconductor is, for example, Si, Ge, $CuInSe_2$, $CuGaSe_2$, Cu (In, Ga) $Se_2$, or the like.

A thickness of the nonmagnetic layer 20 is, for example, 20 Å A or more and may be 25 Å or more. When the thickness of the nonmagnetic layer 20 is large, a resistance area product (RA) of the magnetic domain wall movement element 100 becomes large. The resistance area product (RA) of the magnetic domain wall movement element 100 is preferably $1\times10^4$ $\Omega\mu m^2$ or more, and more preferably $5\times10^4$ $\Omega\mu^2$ or more. The resistance area product (RA) of the magnetic domain wall movement element 100 is expressed as a product of an element resistance of one magnetic domain wall movement element 100 and an element cross-sectional area of the magnetic domain wall movement element 100 (an area of a cut surface obtained by cutting the nonmagnetic layer 20 in the xy plane).

The reference layer 30 interposes the nonmagnetic layer 20 together with the magnetic domain wall movement layer 10. The reference layer 30 is, for example, on the electrode E. The reference layer 30 may be stacked on the substrate Sub. The reference layer 30 is located at a position where it overlaps the magnetic domain wall movement layer 10 in the z direction. The magnetization of the reference layer 30 is less likely to be reversed than the magnetization of the third region A3 of the magnetic domain wall movement layer 10. In the magnetization of the reference layer 30, an orientation does not change when an external force is applied to the extent that the magnetization of the third region A3 is reversed, and the magnetization is fixed. The reference layer 30 may be referred to as a magnetization fixed layer.

The reference layer 30 contains a ferromagnetic material. The reference layer 30 contains, for example, a material that easily obtains a coherent tunneling effect with the magnetic domain wall movement layer 10. The reference layer 30 contains, for example, a metal selected from the group consisting of Cr, Mn, Co, Fe, and Ni, an alloy containing one or more of these metals, an alloy containing these metals and at least one or more elements of B, C, and N, or the like. The reference layer 30 is Co—Fe, Co—Fe—B, or Ni—Fe.

The reference layer 30 may be, for example, a Heusler alloy. The Heusler alloy is a half metal and has a high spin polarization. The Heusler alloy is an intermetallic compound having a chemical composition of XYZ or $X_2YZ$, X is a transition metal element or noble metal element from the Co, Fe, Ni, or Cu group in the periodic table, Y is a transition metal element from the Mn, V, Cr, or Ti group in the periodic table or the same type of element as for X, and Z is a typical element from Groups III to V in the periodic table. The Heusler alloy is, for example, $Co_2FeSi$, $Co_2FeGe$, $Co_2FeGa$, $Co_2MnSi$, $Co_2Mn_{1-a}Fe_aAl_bSi_{1-b}$, $Co_2FeGe_{1-c}Ga_c$, or the like.

Further, the reference layer 30 may have a synthetic structure constituted by a ferromagnetic layer and a nonmagnetic layer, or a synthetic structure constituted by an antiferromagnetic layer, a ferromagnetic layer, and a nonmagnetic layer. In the latter, a magnetization direction of the reference layer 30 is strongly held by the antiferromagnetic layer in the synthetic structure. Therefore, the magnetization of the reference layer 30 is less likely to be affected from the outside. In a case in which the magnetization of the reference layer 30 is oriented in the Z direction (the magnetization of the reference layer 30 is made as a perpendicular magnetization film), it is preferable that, for example, a Co/Ni stacked film, a Co/Pt stacked film, or the like be further provided.

The first magnetization fixed layer 50 and the second magnetization fixed layer 60 are connected to the magnetic domain wall movement layer 10. The first magnetization fixed layer 50 and the second magnetization fixed layer 60 are on the magnetic domain wall movement layer 10. The first magnetization fixed layer 50 and the second magnetization fixed layer 60 are separated from each other in the x direction. The first magnetization fixed layer 50 fixes the magnetization of the first region A1. The second magnetization fixed layer 60 fixes the magnetization of the second region A2.

Each of the first magnetization fixed layer 50 and the second magnetization fixed layer 60 is, for example, a ferromagnetic material. For the first magnetization fixed layer 50 and the second magnetization fixed layer 60, for example, the same material as the reference layer 30 can be applied. Further, each of the first magnetization fixed layer 50 and the second magnetization fixed layer 60 is not limited to the ferromagnetic material. In a case in which each of the first magnetization fixed layer 50 and the second magnetization fixed layer 60 is not the ferromagnetic material, a current density of the current flowing through the magnetic domain wall movement layer 10 in the region overlapping the first magnetization fixed layer 50 or the second magnetization fixed layer 60 is sharply changed, and thus the movement of the magnetic domain wall DW is limited and the magnetization of each of the first region A1 and the second region A2 is fixed.

Further, as shown in FIG. 4, for example, a width of each of the first magnetization fixed layer 50 and the second magnetization fixed layer 60 in the y direction is wider than a width of the magnetic domain wall movement layer 10 in the y direction. A boundary between the first magnetization fixed layer 50 or the second magnetization fixed layer 60 and the magnetic domain wall movement layer 10 extends in the y direction of the magnetic domain wall movement layer 10, and thus magnetic characteristic distribution in the y direction in the magnetic domain wall movement layer 10 becomes uniform. When the magnetic characteristic distribution in the y direction in the magnetic domain wall movement layer 10 becomes uniform, it is possible to suppress tilt of the magnetic domain wall DW with respect to the y direction.

The shape of each of the first magnetization fixed layer 50 and the second magnetization fixed layer 60 in the z direction is, for example, rectangular. The shape of each of the first magnetization fixed layer 50 and the second magnetization fixed layer 60 in the z direction may be, for example, circular, elliptical, oval, or the like.

It is possible to check a magnetization direction of each layer of the magnetic domain wall movement element 100 by measuring a magnetization curve, for example. The magnetization curve can be measured using, for example, a magneto optical Kerr effect (MOKE). The measurement using MOKE is a measurement method performed by making linearly polarized light incident on an object to be measured and using a magneto optical effect (a magnetic Kerr effect) in which rotation in a polarization direction thereof or the like occurs.

Next, a method of manufacturing the magnetic domain wall movement element 100 will be described. The magnetic domain wall movement element 100 is formed by a stacking step of each layer and a processing step of processing a part of each layer into a predetermined shape. For the stacking of each layer, a sputtering method, a chemical vapor deposition (CVD) method, an electron beam vapor deposition method (an EB vapor deposition method), an atomic laser deposit method, or the like can be used. The processing of each layer can be performed using photolithography, etching (for example, Ar etching), or the like.

First, the reference layer, the nonmagnetic layer, the stacked body, and the magnetization fixed layer are stacked in that order on the electrode E and the insulating layer In. In the stacked body, the ferromagnetic layer and the insertion layer are alternately stacked in that order from a side closer to the electrode E. Then, for example, an unnecessary portion of these layers in the x direction and the y direction is removed using the photolithography and the etching. When the unnecessary portion is removed, each layer is processed into a predetermined shape, the reference layer becomes the reference layer 30, the nonmagnetic layer becomes the nonmagnetic layer 20, and the stacked body becomes the magnetic domain wall movement layer 10. Then, the unnecessary portion of the magnetization fixed layer is removed except for two portions of the magnetization fixed layer that overlap end portions of the magnetic domain wall movement layer 10. In the process, the magnetization fixed layer becomes the first magnetization fixed layer 50 and the second magnetization fixed layer 60.

Then, the insulating layer In is stacked on the magnetic domain wall movement layer 10, the first magnetization fixed layer 50, and the second magnetization fixed layer 60. After that, a hole is formed at a position of the insulating layer In overlapping each of the first magnetization fixed layer 50 and the second magnetization fixed layer 60, and the inside of the hole is filled with a conductor, and thus the first conductive layer 71 and the second conductive layer 72 are obtained. By the above procedure, the magnetic domain wall movement element 100 is obtained.

The magnetic domain wall movement element 100 according to the first embodiment has the plurality of ferromagnetic layers 11 containing Co and Fe with the insertion layer 12 interposed therebetween. The magnetization of the ferromagnetic layer 11 exhibits strong perpendicular magnetic anisotropy due to the effect of an interface with the insertion layer 12 (interface perpendicular magnetic anisotropy) and the magnetic coupling between the ferromagnetic layers 11 with the insertion layer 12 interposed therebetween. Therefore, the magnetic domain wall movement element 100 exhibits a high MR ratio and is excellent in controllability of the magnetic domain wall DW.

On the other hand, for example, when the insertion layer 12 is removed from the magnetic domain wall movement layer 10, the thickness of the ferromagnetic layer 11 becomes thick, and the ferromagnetic layer 11 does not exhibit sufficient perpendicular magnetic anisotropy. When the thickness of the magnetic domain wall movement layer 10 with the insertion layer 12 removed (that is, a single-layer ferromagnetic layer 11) is reduced to maintain the perpendicular magnetic anisotropy, a resistance value of the magnetic domain wall movement layer 10 increases. As a result, some of the current flowing in the x direction along the magnetic domain wall movement layer 10 leaks to a side of the reference layer 30 through the nonmagnetic layer 20, and the controllability of the magnetic domain wall DW is lowered.

Further, in the magnetic domain wall movement element 100, the reference layer 30 is closer to the substrate Sub than the magnetic domain wall movement layer 10. Flatness of a stacked film decreases as a distance from the substrate increases, and magnetization stability of a magnetic film formed on the stacked film decreases. The reference layer 30 is a layer that serves as a reference for a change in magnetic resistance, and the MR ratio of the magnetic domain wall movement element 100 increases as the magnetization stability of the reference layer 30 increases.

Further, the magnetic domain wall movement element 100 is manufactured by building up from the substrate Sub. The material of the insertion layer 12 is different from that of the ferromagnetic layer 11, and the insertion layer 12 functions as an etching stopper during manufacturing to prevent the ferromagnetic layer 11 from being damaged. As a result, it is possible to prevent the MR ratio of the magnetic domain wall movement layer 10 from being lowered due to etching damage. Further, the insertion layer 12 prevents element diffusion and prevents a decrease in the MR ratio of the magnetic domain wall movement element 100 when the magnetic domain wall movement element 100 is heat-treated.

Second Embodiment

Figure 5:
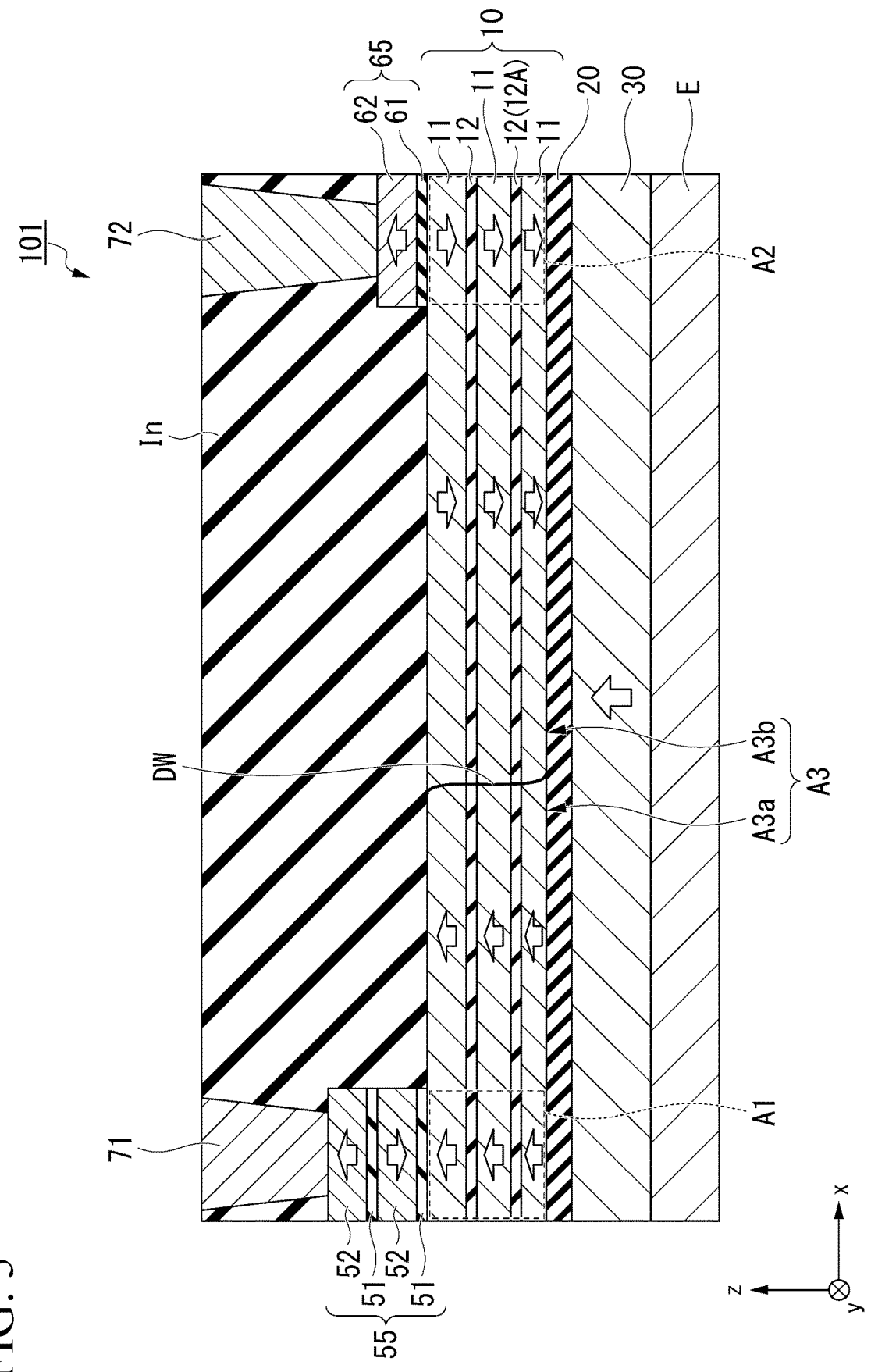
FIG. 5 is a cross-sectional view of a magnetic domain wall movement element according to a second embodiment.

FIG. 5 is a cross-sectional view of a magnetic domain wall movement element 101 according to a second embodiment along an xz plane passing through the center of the magnetic domain wall movement layer 10 in the y direction. The magnetic domain wall movement element 101 according to the second embodiment is different from the magnetic domain wall movement element 100 according to the first embodiment in a configuration of each of a first magnetization fixed layer 55 and a second magnetization fixed layer 65. In the second embodiment, the same constituent elements as those in the first embodiment are designated by the same reference signs, and the description thereof will be omitted.

The first magnetization fixed layer 55 has a magnetic coupling layer 51 and a ferromagnetic layer 52. The magnetic coupling layer 51 and the ferromagnetic layer 52 are alternately stacked. The second magnetization fixed layer 65 has a magnetic coupling layer 61 and a ferromagnetic layer 62. The magnetic coupling layer 61 and the ferromagnetic layer 62 are alternately stacked.

For each of the ferromagnetic layer 52 and the ferromagnetic layer 62, the same material as the reference layer 30 can be used. Each of the magnetic coupling layer 51 and the magnetic coupling layer 61 is a nonmagnetic layer. Each of the magnetic coupling layer 51 and the magnetic coupling layer 61 is, for example, Ru, Ir, or Rh. The adjacent ferromagnetic layers 52 and the adjacent ferromagnetic layers 62 are magnetically coupled in an antiferromagnetic manner.

The first magnetization fixed layer 55 and the second magnetization fixed layer 65 have different thicknesses. For example, the first magnetization fixed layer 55 and the second magnetization fixed layer 65 have different thicknesses due to a difference in the number of constituent layers. For example, the number of the ferromagnetic layers 52 included in the first magnetization fixed layer 55 is different from the number of the ferromagnetic layers 62 included in the second magnetization fixed layer 65. For example, the number of the ferromagnetic layers 52 included in the first magnetization fixed layer 55 is two, and the number of the ferromagnetic layers 62 included in the second magnetization fixed layer 65 is one.

The magnetic domain wall movement element 101 according to the second embodiment exhibits the same effect as the magnetic domain wall movement element 100.

Further, the magnetic domain wall movement element 101 according to the second embodiment can easily reverse the magnetization orientation direction of each of the first region A1 and the second region A2 by simply applying an external magnetic field in one direction. The first magnetization fixed layer 55 and the second magnetization fixed layer 65 have different thicknesses and different saturation magnetization amounts. By utilizing this difference in the saturation magnetization amount, it is possible to make the magnetization orientation direction of the first magnetization fixed layer 55 and the magnetization orientation direction of the second magnetization fixed layer 65 opposite to each other, and thus the magnetization orientation direction of the first region A1 and the magnetization orientation direction of the second region A2 become opposite to each other.

Third Embodiment

Figure 6:
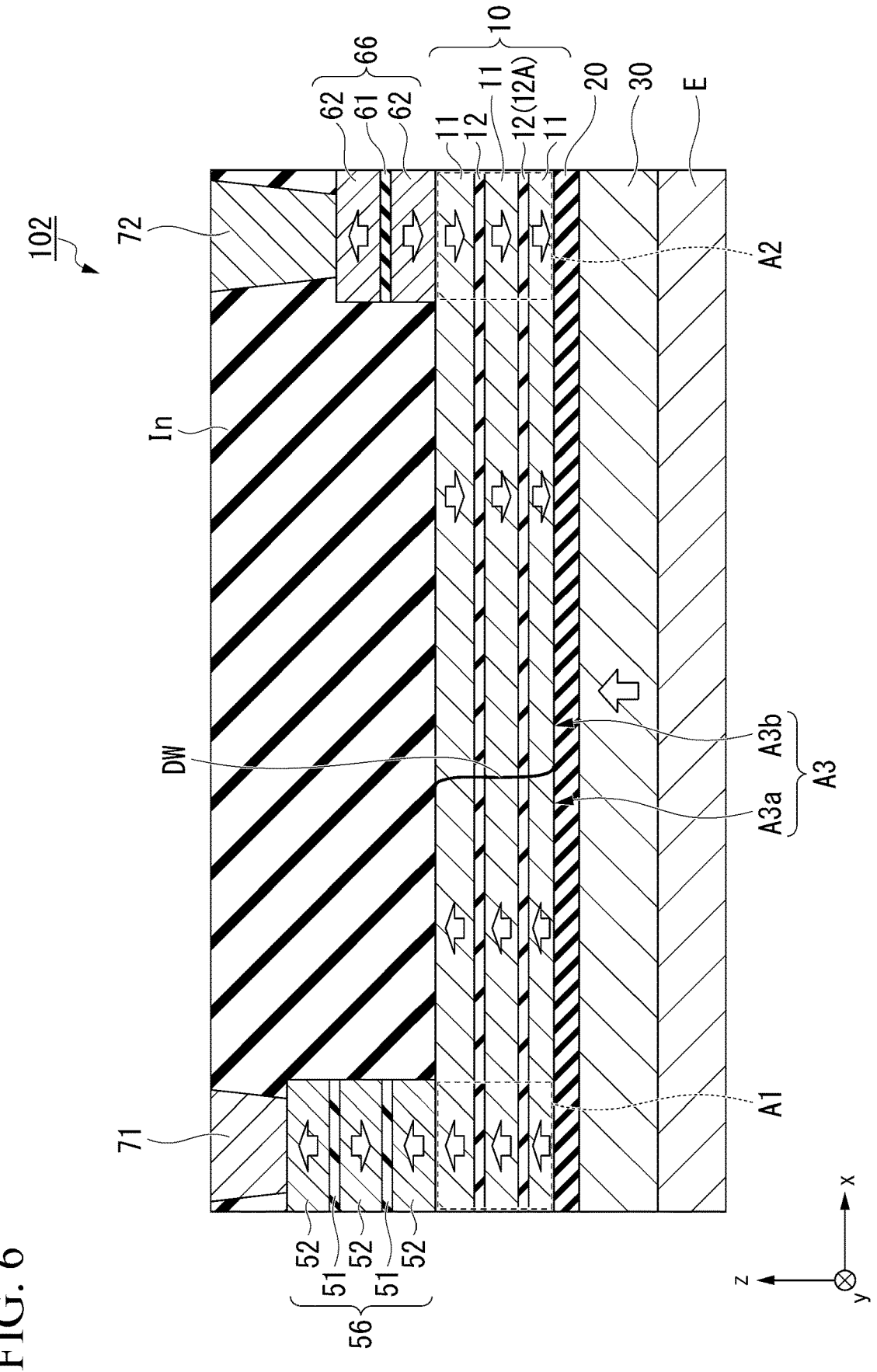
FIG. 6 is a cross-sectional view of a magnetic domain wall movement element according to a third embodiment.

FIG. 6 is a cross-sectional view of a magnetic domain wall movement element 102 according to a third embodiment along an xz plane passing through the center of the magnetic domain wall movement layer 10 in the y direction. The magnetic domain wall movement element 102 according to the third embodiment is different from the magnetic domain wall movement element 101 according to the second embodiment in a configuration of each of a first magnetization fixed layer 56 and a second magnetization fixed layer 66. In the third embodiment, the same constituent elements as those in the second embodiment are designated by the same reference signs, and the description thereof will be omitted.

The first magnetization fixed layer 56 is different from the first magnetization fixed layer 55 according to the second embodiment in a stacking order of the magnetic coupling layer 51 and the ferromagnetic layer 52. The second magnetization fixed layer 66 is also different from the second magnetization fixed layer 65 according to the second embodiment in a stacking order of the magnetic coupling layer 61 and the ferromagnetic layer 62. The ferromagnetic layer 52 closest to the substrate Sub in the first magnetization fixed layer 56 is in direct contact with the ferromagnetic layer 11 of the magnetic domain wall movement layer 10. Further, the ferromagnetic layer 62 closest to the substrate Sub in the second magnetization fixed layer 66 is in direct contact with the ferromagnetic layer 11 of the magnetic domain wall movement layer 10.

The magnetic domain wall movement element 102 according to the third embodiment exhibits the same effect as the magnetic domain wall movement element 101. Further, the ferromagnetic layer 11 of the magnetic domain wall movement layer 10 and the ferromagnetic layers 52 and 62 of the first magnetization first magnetization fixed layer 56 and the second magnetization fixed layer 66 are in direct contact with each other, and thus magnetic connection between the magnetic domain wall movement layer 10 and each of the first magnetization fixed layer 56 and the second magnetization fixed layer 66 becomes strong. As a result, the magnetization of each of the first region A1 and the second region A2 is strongly fixed, and the magnetic domain wall DW can be prevented from invading the first region A1 or the second region A2.

Fourth Embodiment

Figure 7:
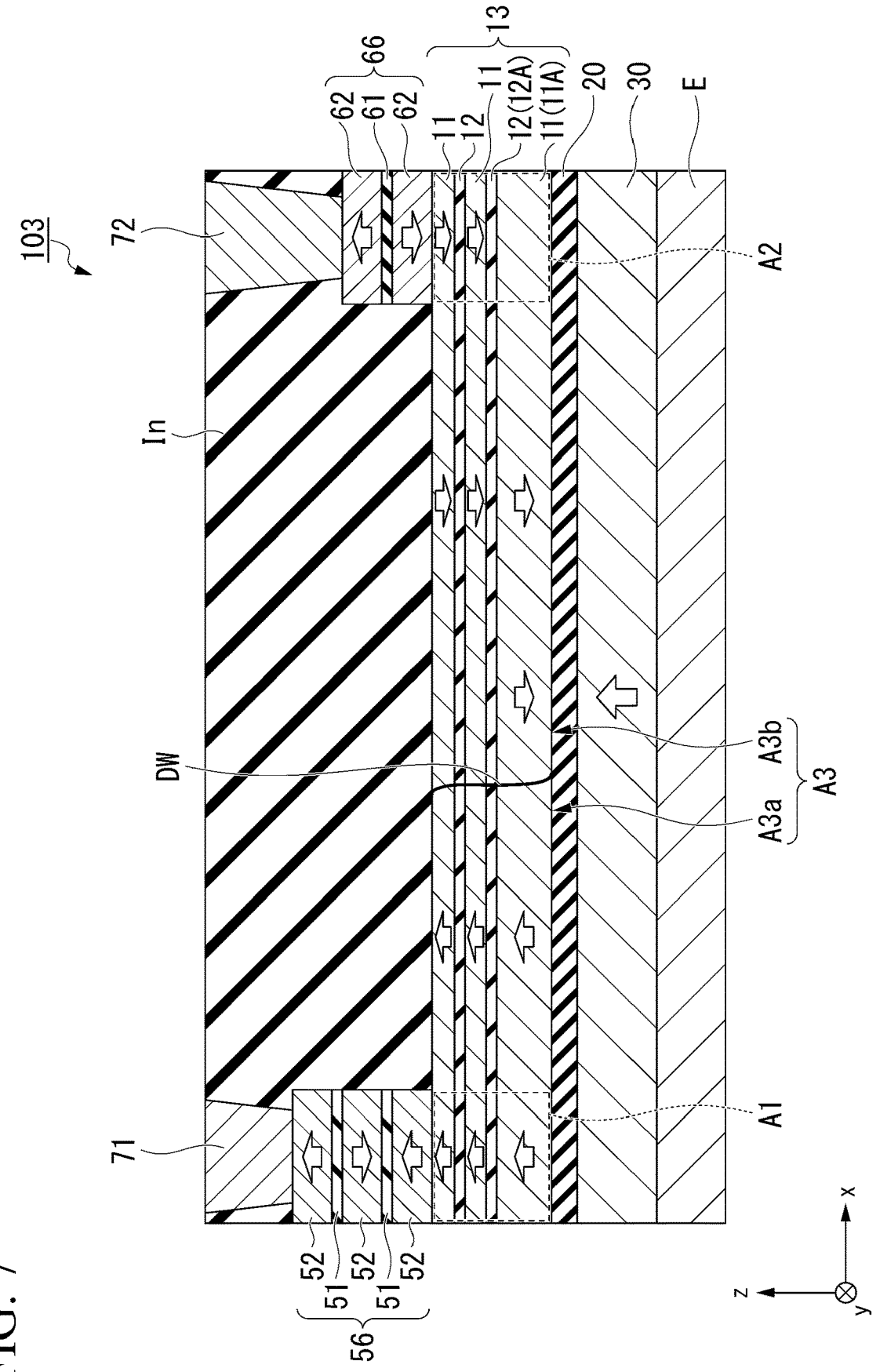
FIG. 7 is a cross-sectional view of a magnetic domain wall movement element according to a fourth embodiment.

FIG. 7 is a cross-sectional view of a magnetic domain wall movement element 103 according to a fourth embodiment along an xz plane passing through the center of a magnetic domain wall movement layer 13 in the y direction. The magnetic domain wall movement element 103 according to the fourth embodiment is different from the magnetic domain wall movement element 102 according to the third embodiment in a configuration of the magnetic domain wall movement layer 13. In the fourth embodiment, the same constituent elements as those in the third embodiment are designated by the same reference signs, and the description thereof will be omitted.

The magnetic domain wall movement layer 13 has the ferromagnetic layer 11 and the insertion layer 12. The ferromagnetic layer 11 and the insertion layer 12 are alternately stacked. A first ferromagnetic layer 11A closest to the nonmagnetic layer 20 among the ferromagnetic layers 11 included in the magnetic domain wall movement layer 13 is thicker than other ferromagnetic layers 11 included in the magnetic domain wall movement layer 13.

The magnetic domain wall movement element 103 according to the fourth embodiment exhibits the same effect as the magnetic domain wall movement element 102.

As described above, since the magnetic domain wall movement element 103 is processed from above, as it is closer to the substrate Sub, the possibility of damage is lowered. By an increase of the thickness of the first ferromagnetic layer 11A on the side close to the substrate Sub, the controllability of the magnetic domain wall DW of the magnetic domain wall movement element 103 is enhanced. Further, since the insertion layer 12 also functions as an etching stopper, by locating the insertion layers 12 more in an upper portion of the magnetic domain wall movement layer 13, it is possible to further suppress processing damage to the magnetic domain wall movement element 103.

Fifth Embodiment

Figure 8:
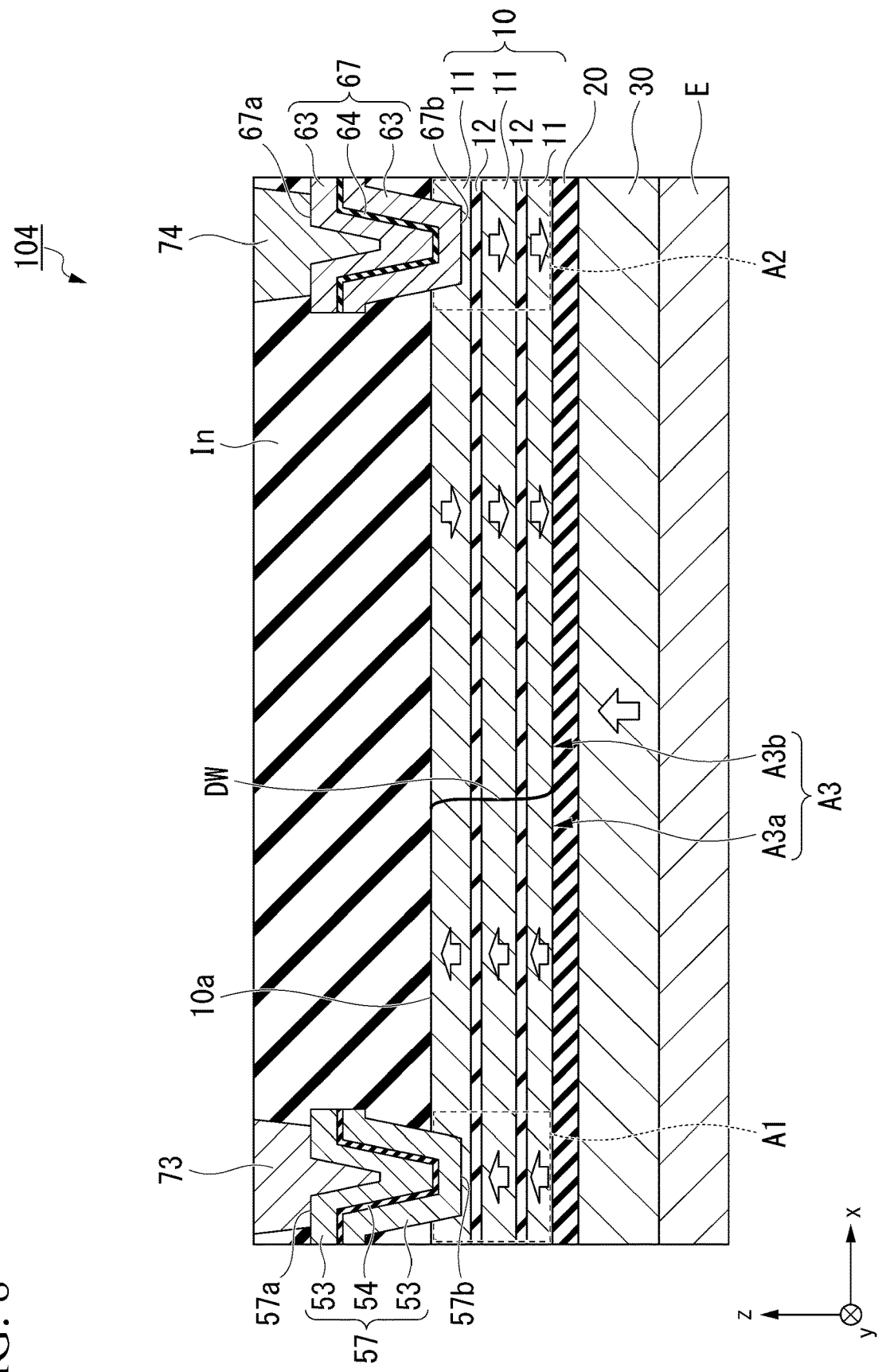
FIG. 8 is a cross-sectional view of a magnetic domain wall movement element according to a fifth embodiment.

FIG. 8 is a cross-sectional view of a magnetic domain wall movement element 104 according to a fifth embodiment along an xz plane passing through the center of the magnetic domain wall movement layer 10 in the y direction. The magnetic domain wall movement element 104 according to the fifth embodiment is different from the magnetic domain wall movement element 100 according to the first embodiment in a configuration of each of a first magnetization fixed layer 57 and a second magnetization fixed layer 67. In the fifth embodiment, the same constituent elements as those in the first embodiment are designated by the same reference signs, and the description thereof will be omitted.

A part of the first magnetization fixed layer 57 is inserted into the magnetic domain wall movement layer 10. A lower surface 57b of the first magnetization fixed layer 57 is below an upper surface 10a of the third region A3 of the magnetic domain wall movement layer 10. The first magnetization fixed layer 57 is obtained by the insulating layer In being stacked on the magnetic domain wall movement layer 10, by a groove being formed in the insulating layer In, and by a ferromagnetic layer 53 and a magnetic coupling layer 54 being alternately stacked in the groove. The first magnetization fixed layer 57 alternately has the ferromagnetic layer 53 and the magnetic coupling layer 54.

A part of the second magnetization fixed layer 67 is inserted into the magnetic domain wall movement layer 10. A lower surface 67b of the second magnetization fixed layer 67 is below the upper surface 10a of the third region A3 of the magnetic domain wall movement layer 10. The second magnetization fixed layer 67 is obtained by the insulating layer In being stacked on the magnetic domain wall movement layer 10, by a groove being formed in the insulating layer In, and by a ferromagnetic layer 63 and a magnetic coupling layer 64 being alternately stacked in the groove. The second magnetization fixed layer 67 alternately has the ferromagnetic layer 63 and the magnetic coupling layer 64.

An upper surface 57a of the first magnetization fixed layer 57 and an upper surface 67a of the second magnetization fixed layer 67 are recessed in the z direction according to a shape of the groove. A first conductive layer 73 is fitted in a recess of the upper surface 57a. Further, a second conductive layer 74 is fitted in a recess of the upper surface 67a.

The ferromagnetic layers 53 and 63 are made of the same material as the ferromagnetic layers 52 and 62. The magnetic coupling layers 54 and 64 are made of the same material as the magnetic coupling layers 51 and 61.

The magnetic domain wall movement element 104 according to the fifth embodiment exhibits the same effect as the magnetic domain wall movement element 100.

Further, in the magnetic domain wall movement element 104 according to the fifth embodiment, a part of each of the first magnetization fixed layer 57 and the second magnetization fixed layer 67 invades the magnetic domain wall movement layer 10. Therefore, magnetic connection between the magnetic domain wall movement layer 10 and each of the first magnetization fixed layer 57 and the second magnetization fixed layer 67 becomes strong, and the magnetization is strongly fixed.

Sixth Embodiment

Figure 9:
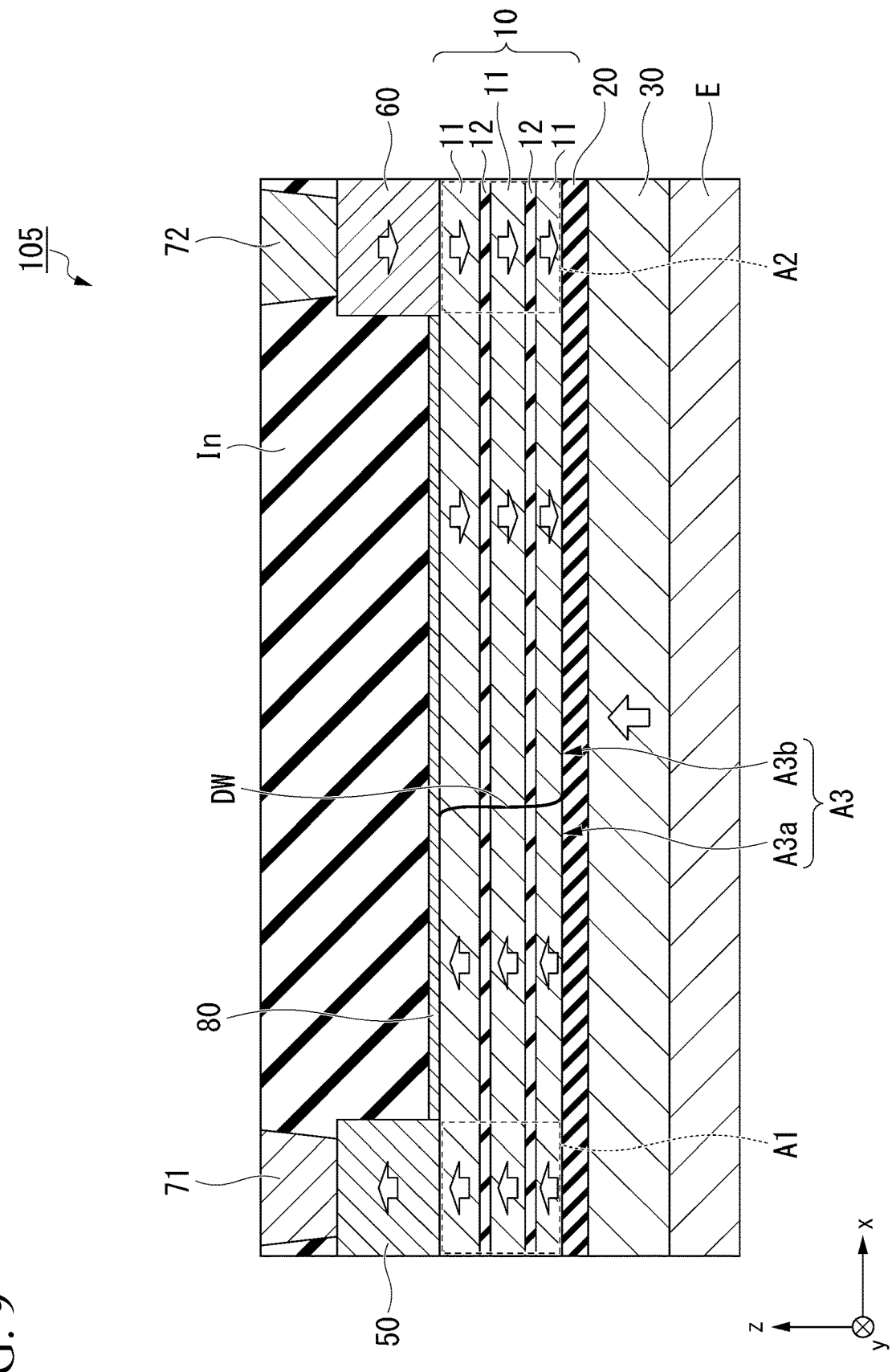
FIG. 9 is a cross-sectional view of a magnetic domain wall movement element according to a sixth embodiment.

FIG. 9 is a cross-sectional view of a magnetic domain wall movement element 105 according to a sixth embodiment along an xz plane passing through the center of the magnetic domain wall movement layer 10 in the y direction. The magnetic domain wall movement element 105 according to the sixth embodiment is different from the magnetic domain wall movement element 100 according to the first embodiment in that it further includes a perpendicular magnetic induction layer 80. In the sixth embodiment, the same constituent elements as those in the first embodiment are designated by the same reference signs, and the description thereof will be omitted.

The perpendicular magnetic induction layer 80 is on the magnetic domain wall movement layer 10. The perpendicular magnetic induction layer 80 is on the third region A3 of the magnetic domain wall movement layer 10, for example. The perpendicular magnetic induction layer 80 enhances the perpendicular magnetic anisotropy of the ferromagnetic layer 11 of the magnetic domain wall movement layer 10. The perpendicular magnetic induction layer 80 contains, for example, any one selected from the group consisting of MgO, Mg—Al—O, Mg, W, Mo, Ta, Pd, and Pt.

The magnetic domain wall movement element 105 according to the sixth embodiment exhibits the same effect as the magnetic domain wall movement element 100. Further, the perpendicular magnetic anisotropy of the ferromagnetic layer 11 is enhanced by the perpendicular magnetic induction layer 80, and the stability of the magnetic domain wall movement element 105 against disturbance from the outside is further increased.

Figure 10:
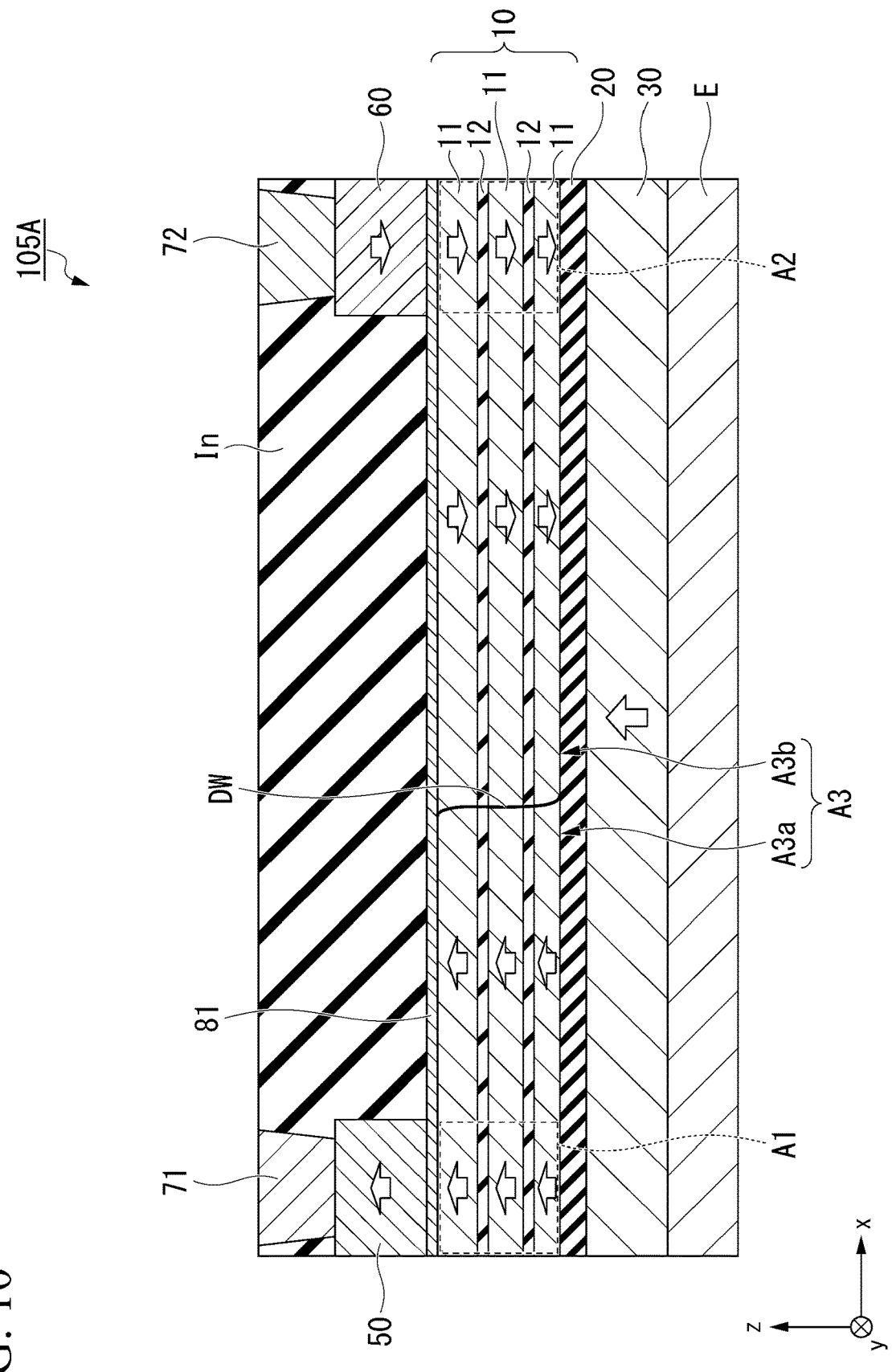
FIG. 10 is a cross-sectional view of a modification example of the magnetic domain wall movement element according to the sixth embodiment.

FIG. 10 is a cross-sectional view of a modification example of the magnetic domain wall movement element according to the sixth embodiment. The magnetic domain wall movement element 105A shown in FIG. 10 is different from the magnetic domain wall movement element 105 shown in FIG. 9 in that a perpendicular magnetic induction layer 81 extends between the first magnetization fixed layer 50 and the magnetic domain wall movement layer 10 and between the second magnetization fixed layer 60 and the magnetic domain wall movement layer 10.

The perpendicular magnetic induction layer 81 is located at at least one of a portion between the first magnetization fixed layer 50 and the magnetic domain wall movement layer 10 and a portion between the second magnetization fixed layer 60 and the magnetic domain wall movement layer 10. When the perpendicular magnetic induction layer 81 is located between the first magnetization fixed layer 50 or the second magnetization fixed layer 60 and the magnetic domain wall movement layer 10, the magnetization stability of each of the first region A1 and the second region A2 is enhanced, and it is possible to suppress the movement of the magnetic domain wall DW toward each of the first region A1 or the second region A2. The thickness of the portion of the perpendicular magnetic induction layer 81 that is inserted between the first magnetization fixing layer 50 and the magnetic domain wall moving layer 10, or between the second magnetization fixing layer 60 and the magnetic domain wall moving layer 10, should be thicker than the thickness of the insertion layer 12 in a range within the ferromagnetic coupling between the magnetic wall moving layer 10 and the first magnetization fixing layer 50, or between the magnetic wall moving layer 10 and the second magnetization fixing layer 60, can be maintained. Further, the thickness of the perpendicular magnetic induction layer 81 other than the portion inserted between the above may be thinner than the thickness of the portion inserted between them.

Seventh Embodiment

Figure 11:
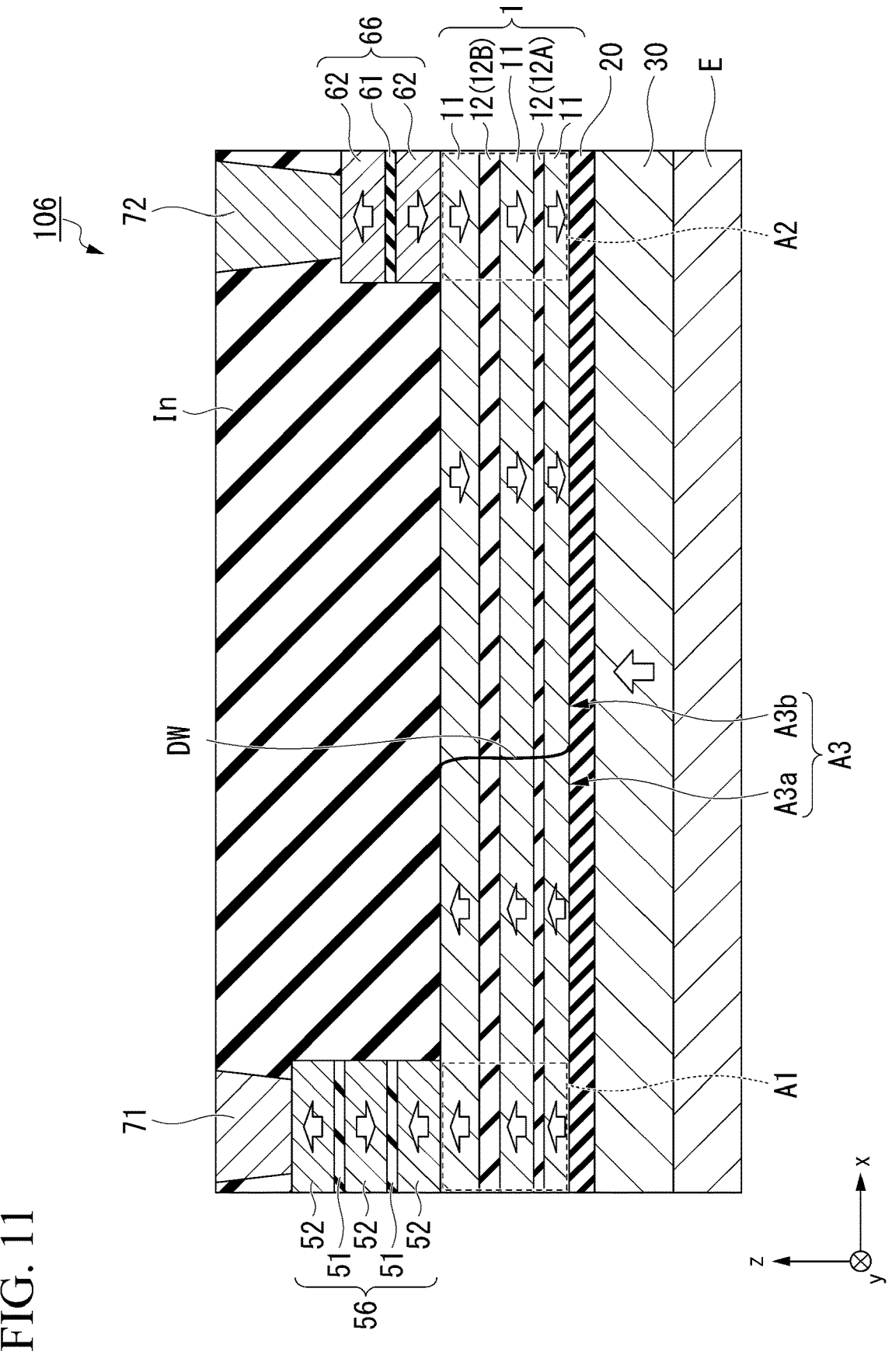
FIG. 11 is a cross-sectional view of a magnetic domain wall movement element according to a seventh embodiment.

FIG. 11 is a cross-sectional view of a magnetic domain wall movement element 106 according to a seventh embodiment along an xz plane passing through the center of a magnetic domain wall movement layer 14 in the y direction. The magnetic domain wall movement element 106 according to the seventh embodiment is different from the magnetic domain wall movement element 102 according to the third embodiment in a configuration of the magnetic domain wall movement layer 14. In the seventh embodiment, the same constituent elements as those in the third embodiment are designated by the same reference signs, and the description thereof will be omitted. The magnetic domain wall movement layer 14 has the ferromagnetic layer 11 and the insertion layer 12. The ferromagnetic layer 11 and the insertion layer 12 are alternately stacked. An insertion layer 12B farthest from the nonmagnetic layer 20 among the insertion layers 12 included in the magnetic domain wall movement layer 14 is thicker than other insertion layers 12 included in the magnetic domain wall movement layer 14.

The magnetic domain wall movement element 106 according to the seventh embodiment exhibits the same effect as the magnetic domain wall movement element 102.

As described above, since the magnetic domain wall movement element 106 is processed from above, as it is closer to the substrate Sub, the possibility of damage is lowered. By increasing the thickness of the insertion layer 12 at a position away from the substrate Sub, it is possible to further suppress processing damage to the magnetic domain wall movement element 106 (particularly damage to the ferromagnetic layer 11 having a large influence on the MR ratio).

Although the preferred embodiments of the present invention have been described in detail above, the present invention is not limited to these embodiments. For example, the characteristic configurations of the embodiments may be combined, or a part thereof may be changed without changing the gist of the invention.

EXPLANATION OF REFERENCES

10, 13, 14 Magnetic domain wall movement layer
10a, 57a, 67a Upper surface
11, 52, 53, 62, 63 Ferromagnetic layer
11A First ferromagnetic layer
12 Insertion layer
12A First insertion layer
20 Nonmagnetic layer
30 Reference layer
40 Magnetoresistance effect element
50, 55, 56, 57 First magnetization fixed layer
51, 54, 61, 64 Magnetic coupling layer
57b, 67b Lower surface
60, 65, 66, 67 Second magnetization fixed layer
71, 73 First conductive layer
72, 74 Second conductive layer
80, 81 Perpendicular magnetic induction layer
100, 101, 102, 103, 104, 105 Magnetic domain wall movement element
200 Magnetic array
A1 First region
A2 Second region
A3 Third region
A3a First magnetic domain
A3b Second magnetic domain
In Insulating layer

What is claimed is:

1. A magnetic domain wall movement element comprising:

a magnetoresistance effect element that has a reference layer, a nonmagnetic layer, and a magnetic domain wall movement layer in order from a side closer to a substrate; and a first magnetization fixed layer and a second magnetization fixed layer which are each in contact with the magnetic domain wall movement layer and are separated from each other, wherein the magnetic domain wall movement layer includes a plurality of ferromagnetic layers and a plurality of insertion layers that are thinner than the plurality of ferromagnetic layers and are alternately sandwiched between the plurality of ferromagnetic layers, wherein each of the plurality of ferromagnetic layers contains Co and Fe and has perpendicular magnetic anisotropy, wherein each of the plurality of insertion layers contains a nonmagnetic material selected from the group consisting of MgO, Mg—Al—O, Mg, W, Mo, and Ta, wherein at least one of the plurality of insertion layers includes a plurality of insertion regions that contain the nonmagnetic material and are dispersed in an island shape in a ferromagnetic layer containing Co and Fe, and wherein, when writing is performed, a write current is allowed to flow between the first magnetization fixed layer and the second magnetization fixed layer along the magnetic domain wall movement layer.

2. The magnetic domain wall movement element according to claim 1, wherein the first magnetization fixed layer and the second magnetization fixed layer have different thicknesses.

3. The magnetic domain wall movement element according to claim 1, wherein the first magnetization fixed layer and the second magnetization fixed layer each have one or more magnetic coupling layers and one or more ferromagnetic layers which are alternately stacked, and wherein the number of the one or more ferromagnetic layers included in the first magnetization fixed layer is different from the number of the one or more ferromagnetic layers included in the second magnetization fixed layer.

4. The magnetic domain wall movement element according to claim 1, wherein a first insertion layer closest to the nonmagnetic layer among the plurality of insertion layers contains any one selected from the group consisting of W, Mo, and Ta, and wherein any one of the plurality of insertion layers other than the first insertion layer contains MgO or Mg—Al—O.

5. The magnetic domain wall movement element according to claim 1, wherein a first ferromagnetic layer closest to the nonmagnetic layer among the plurality of ferromagnetic layers included in the magnetic domain wall movement layer is thicker than other ferromagnetic layers included in the magnetic domain wall movement layer.

6. The magnetic domain wall movement element according to claim 1, wherein an insertion layer farthest from the nonmagnetic layer among the plurality of insertion layers included in the magnetic domain wall movement layer is thicker than other insertion layers included in the magnetic domain wall movement layer.

7. The magnetic domain wall movement element according to claim 1, wherein a lower surface of each of the first magnetization fixed layer and the second magnetization fixed layer is below an upper surface of the magnetic domain wall movement layer.

8. The magnetic domain wall movement element according to claim 1, further comprising:

a perpendicular magnetic induction layer, wherein the perpendicular magnetic induction layer is on the magnetic domain wall movement layer.

9. The magnetic domain wall movement element according to claim 8, wherein the perpendicular magnetic induction layer contains any one selected from the group consisting of MgO, Mg—Al—O, Mg, W, Mo, Ta, Pd, and Pt.

10. The magnetic domain wall movement element according to claim 8, wherein the perpendicular magnetic induction layer is located at at least one of a portion between the first magnetization fixed layer and the magnetic domain wall movement layer and a portion between the second magnetization fixed layer and the magnetic domain wall movement layer.

11. The magnetic domain wall movement element according to claim 1, further comprising:

a first conductive layer in contact with the first magneti-
zation fixed layer and a second conductive layer in
contact with the second magnetization fixed layer, wherein the first conductive layer is fitted to a recess
formed in an upper surface of the first conductive layer.

12. A magnetic array comprising a plurality of the mag-
netic domain wall movement elements according to claim 1.

13. The magnetic domain wall movement element accord-
ing to claim 1, wherein each of the plurality of insertion
layers contains any one selected from the group consisting
of Mg—Al—O, Mg, W, Mo, and Ta.

14. The magnetic domain wall movement element accord-
ing to claim 1, wherein:

the nonmagnetic layer is sandwiched directly between the
reference layer and a first ferromagnetic layer of the
plurality of ferromagnetic layers, and the plurality of insertion layers are arranged on an oppo-
site side of the first ferromagnetic layer from the
nonmagnetic layer.

15. The magnetic domain wall movement element according to claim 14, wherein the nonmagnetic layer contains:

a nonmagnetic insulator selected from the group consist-
ing of $Al_2O_3$, $SiO_2$, MgO, $MgAl_2O_4$, and a material in
which a part of Al, Si, or Mg is replaced with Zn or Be, a nonmagnetic metal selected from the group consisting
of Cu, Au, and Ag, or a nonmagnetic semiconductor
selected from the group consisting of Si, Ge, $CuInSe_2$,
$CuGaSe_2$, and Cu (In, Ga) $Se_2$.

* * * * *